United States Patent
Chen et al.

(10) Patent No.: US 11,250,921 B1
(45) Date of Patent: Feb. 15, 2022

(54) PROGRAMMING AND VERIFYING METHOD FOR MULTILEVEL MEMORY CELL ARRAY

(71) Applicant: eMemory Technology Inc., Hsin-Chu (TW)

(72) Inventors: Ying-Je Chen, Hsinchu County (TW); Wei-Ming Ku, Hsinchu County (TW); Wein-Town Sun, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 8 days.

(21) Appl. No.: 17/069,889

(22) Filed: Oct. 14, 2020

(30) Foreign Application Priority Data

Sep. 15, 2020 (TW) .................................. 109131727

(51) Int. Cl.
  *G11C 16/04* (2006.01)
  *G11C 16/34* (2006.01)
  *G11C 16/26* (2006.01)
  *G11C 16/14* (2006.01)
  *G11C 16/08* (2006.01)

(52) U.S. Cl.
  CPC .......... *G11C 16/3459* (2013.01); *G11C 16/08* (2013.01); *G11C 16/14* (2013.01); *G11C 16/26* (2013.01)

(58) Field of Classification Search
  CPC ..... G11C 16/3459; G11C 16/08; G11C 16/14; G11C 16/26
  See application file for complete search history.

(56) References Cited

U.S. PATENT DOCUMENTS

| | | | |
|---|---|---|---|
| 8,239,735 B2 * | 8/2012 | Shalvi | G11C 11/5628 714/774 |
| 8,873,288 B2 * | 10/2014 | Sharon | G11C 11/5642 365/185.09 |
| 8,941,167 B2 | 1/2015 | Chen et al. | |
| 9,466,379 B2 | 10/2016 | Lee | |
| 9,466,389 B2 | 10/2016 | Ahn | |
| 10,121,545 B2 | 11/2018 | Oh | |
| 2004/0240269 A1 | 12/2004 | Cernea | |
| 2005/0057968 A1 * | 3/2005 | Lutze | G11C 29/50 365/185.18 |
| 2010/0315870 A1 | 12/2010 | Abedifard | |
| 2013/0007566 A1 * | 1/2013 | Shalvi | G11C 11/5621 714/773 |
| 2016/0260727 A1 | 9/2016 | Tsao et al. | |
| 2019/0314110 A1 | 10/2019 | Piferi et al. | |

OTHER PUBLICATIONS

Search report issued by EPO dated May 18, 2021.

* cited by examiner

*Primary Examiner* — Pho M Luu
(74) *Attorney, Agent, or Firm* — WPAT, PC

(57) ABSTRACT

A programming and verifying method for a multi-level memory cell array includes following steps. In a step (a1), a first row of the multi-level memory cell array is set as a selected row, and A is set as 1. In a step (a2), memory cells in the selected row excluding the memory cells in the target storage state and bad memory cells are programmed to the A-th storage state. In a step (a3), if A is not equal to X, 1 is added to X and the step (a2) is performed again. In a step (a4), if A is equal to X, the program cycle is ended. In the step (a2), the first-portion memory cells of the selected row are subjected to plural write actions and plural verification actions until all of the first-portion memory cells reach the A-th storage state.

7 Claims, 9 Drawing Sheets

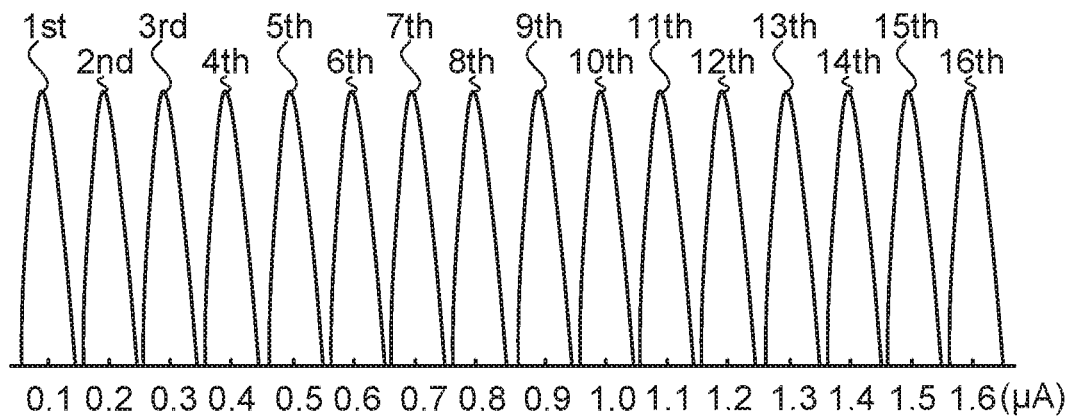
FIG. 3A
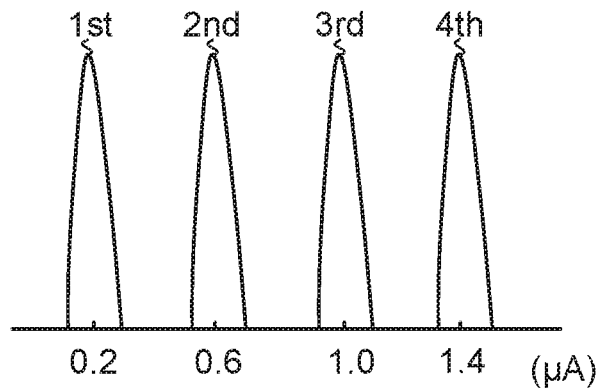
FIG. 3B
|  | WL | SL | NW | EL | BL | SH | PW |
|---|---|---|---|---|---|---|---|
| PGM | Von1 | Vpp | Vpp | $V_{EL}$ | 0V | $V_{EL}$ | 0V |
| PGM inhibit | Von1 | Vpp | Vpp | $V_{EL}$ | F | $V_{EL}$ | 0V |
| READ | Von2 | 2.1V | 2.1V | 0V | 1.2V | 0V | 0V |
| READ inhibit | Von2 | 2.1V | 2.1V | 0V | F | 0V | 0V |
| ERS | 0V | 0V | 0V | 14V | 0V | 0V | 0V |
FIG. 4

| | $Q_2[1]$ | $Q_2[2]$ | $Q_2[3]$ | $Q_2[4]$ | $Q_2[5]$ | $Q_2[6]$ | $Q_2[7]$ | $Q_2[8]$ |
|---|---|---|---|---|---|---|---|---|
| Vpp | 6.45V | 6.5V | 6.55V | 6.6V | 6.6V | 6.6V | 6.6V | 6.6V |
| $V_{EL}$ | 1.5V | 1.5V | 1.5V | 1.5V | 1.75V | 2V | 2.25V | 2.5V |
| Write count | 24 | 24 | 24 | 24 | 24 | 24 | 24 | 24 |

|  | $Q_1[1]$ | $Q_1[2]$ | $Q_1[3]$ | $Q_1[4]$ | $Q_1[5]$ | $Q_1[6]$ | $Q_1[7]$ | $Q_1[8]$ |
|---|---|---|---|---|---|---|---|---|
| Vpp | 6.35V | 6.4V | 6.45V | 6.5V | 6.5V | 6.5V | 6.5V | 6.5V |
| $V_{EL}$ | 1.5V | 1.5V | 1.5V | 1.5V | 1.75V | 2V | 2.25V | 2.5V |
| Write count | 24 | 24 | 24 | 24 | 24 | 24 | 24 | 24 |

|  | $Q_2[1]$ | $Q_2[2]$ | $Q_2[3]$ | $Q_2[4]$ | $Q_2[5]$ | $Q_2[6]$ | $Q_2[7]$ | $Q_2[8]$ |
|---|---|---|---|---|---|---|---|---|
| Vpp | 6.45V | 6.5V | 6.55V | 6.6V | 6.6V | 6.6V | 6.6V | 6.6V |
| $V_{EL}$ | 1.5V | 1.5V | 1.5V | 1.5V | 1.75V | 2V | 2.25V | 2.5V |
| Write count | 24 | 24 | 24 | 24 | 24 | 24 | 24 | 24 |

|  | $Q_3[1]$ | $Q_3[2]$ | $Q_3[3]$ | $Q_3[4]$ | $Q_3[5]$ | $Q_3[6]$ | $Q_3[7]$ | $Q_3[8]$ |
|---|---|---|---|---|---|---|---|---|
| Vpp | 6.65V | 6.7V | 6.75V | 6.8V | 6.8V | 6.8V | 6.8V | 6.8V |
| $V_{EL}$ | 1.75V | 1.75V | 1.75V | 1.75V | 2V | 2.25V | 2.5V | 2.75V |
| Write count | 24 | 24 | 24 | 24 | 24 | 24 | 24 | 24 |

|  | $Q_4[1]$ | $Q_4[2]$ | $Q_4[3]$ | $Q_4[4]$ | $Q_4[5]$ | $Q_4[6]$ | $Q_4[7]$ | $Q_4[8]$ |
|---|---|---|---|---|---|---|---|---|
| Vpp | 6.8V | 6.85V | 6.9V | 6.95V | 6.95V | 6.95V | 6.95V | 6.95V |
| $V_{EL}$ | 2.25V | 2.25V | 2.25V | 2.25V | 2.5V | 2.75V | 3V | 3.25V |
| Write count | 24 | 24 | 24 | 24 | 24 | 24 | 24 | 24 |

FIG. 7

PROGRAMMING AND VERIFYING METHOD FOR MULTILEVEL MEMORY CELL ARRAY

This application claims the benefit of Taiwan Patent Application No. 109131727, filed Sep. 15, 2020, the subject matter of which is incorporated herein by reference.

FIELD OF THE INVENTION

The present invention relates to a control method for a memory cell array, and more particularly to a programming and verifying method for a multi-level memory cell array.

BACKGROUND OF THE INVENTION

As is well known, a non-volatile memory is able to continuously retain data after the supplied power is interrupted. Consequently, the non-volatile memory is widely applied to a variety of electronic devices. Generally, the non-volatile memories are classified into a one-time programmable non-volatile memory (also referred as an OTP non-volatile memory) and a multi-time programmable non-volatile memory (also referred as an MTP non-volatile memory). The memory cells of the OTP non-volatile memory are OTP memory cells. The memory cells of the MTP non-volatile memory are MTP memory cells.

FIG. 1A is a schematic circuit diagram illustrating a conventional MTP memory cell with a floating gate transistor. FIG. 1B schematically illustrates bias voltages for performing associated operations on the MTP memory cell as shown in FIG. 1A. For example, the MTP memory cell is disclosed in U.S. Pat. No. 8,941,167.

As shown in FIG. 1A, the MTP memory cell 100 comprises a select transistor T, a floating gate transistor M and a capacitor C. The select transistor T and the floating gate transistor M are P-type transistors and constructed in an N-type well region NW. The capacitor C is an N-type transistor and constructed in a P-type well region PW.

The source terminal of the select transistor T is connected with a source line SL. The gate terminal of the select transistor T is connected with a word line WL. The source terminal of the floating gate transistor M is connected with the drain terminal of the select transistor T. The drain terminal of the floating gate transistor M is connected with a bit line BL. The gate terminal of the N-type transistor is the first terminal of the capacitor C and connected with the floating gate of the floating gate transistor M. The drain terminal and the source terminal of the N-type transistor are connected with each other and served as the second terminal of the capacitor C. The second terminal of the capacitor C is connected with an erase line EL. A program path and a read path are connected between the source line SL and the bit line BL. An erase path is connected between the floating gate and the erase line EL.

Please refer to FIG. 1B. During a program cycle, a write action is performed. Consequently, the memory cell 100 is programmed to a specified storage state. For writing the memory cell 100, proper bias voltages are provided to the memory cell 100. Consequently, the memory cell 100 is programmed, or the memory cell 100 is subjected to a program inhibition. When the memory cell 100 is programmed, hot carriers are injected into the floating gate of the floating gate transistor M. When the memory cell 100 is subjected to the program inhibition, hot carriers are not injected into the floating gate of the floating gate transistor M. Moreover, the hot carriers are electrons.

When the program action is performed on the memory cell 100, an on voltage (e.g., 4V) is provided to the word line WL, a program voltage (e.g., 8V) is provided to the source line SL and the N-type well region NW, and a ground voltage (e.g., 0V) is provided to the bit line BL, the erase line EL and the P-type well region PW. Meanwhile, the select the transistor T is turned on, and the program path between the source line SL and the bit line BL generates a program current. Consequently, the electrons are injected into the floating gate through a channel region of the floating gate transistor.

When the program inhibition is performed on the memory cell 100, an on voltage (e.g., 4V) is provided to the word line WL, a program voltage (e.g., 8V) is provided to the source line SL and the N-type well region NW, a ground voltage (e.g., 0V) is provided to the erase line EL and the P-type well region PW, and the bit line BL is in a floating state (F). Meanwhile, no program current is generated between the source line SL and the bit line BL. Consequently, no electrons are injected into the floating gate of the floating gate transistor M.

During a read cycle (READ), a read action is performed to judge the storage state of the memory cell 100. For performing the read action, an on voltage (e.g., 0V) is provided to the word line WL, a read voltage Vr (e.g., 3V) is provided to the source line SL and the N-type well region NW, a bias voltage of 0.4V is provided to the bit line BL, and the ground voltage (e.g., 0V) is provided to the erase line EL and the P-type well region PW. Meanwhile, the select the transistor T is turned on, and the read path between the source line SL and the bit line BL generates a read current.

The magnitude of the read current is dependent on the amount of electrons stored in the floating gate of the floating gate transistor M. The storage state of the memory cell 100 is determined according to the magnitude of the read current. For example, in case that the memory cell 100 is in a first storage state, no electrons are stored in the floating gate and the read current is very low (e.g., nearly zero). Whereas, in case that the memory cell 100 is in a second storage state, electrons are stored in the floating gate and the read current is higher.

During the read cycle READ, a sense amplifier (not shown) is connected with the bit line BL to receive the read current. According to the magnitude of the read current flowing through the bit line BL, the sense amplifier determines that the memory cell 100 is in the first storage state or the second storage state.

During an erase cycle (ERS), a ground voltage (e.g., 0V) is provided to the source line SL, the N-type well region NW, the word line WL, the bit line BL and the P-type well region PW, and an erase voltage (e.g., 14V) is provided to the erase line EL. Consequently, the electrons stored in the floating gate are ejected to the erase line EL through the erase path. That is, the electrons stored in the floating gate are transferred to the erase line EL through the capacitor C and departed from the memory cell 100.

The conventional memory cell 100 is a single-level memory cell. That is, one memory cell is able to store a 1-bit data. This 1-bit data indicates the first storage state or the second storage state. During the program cycle, the memory cell 100 is selectively in the first storage state or the second storage state according to the result of injecting the hot carriers into the floating gate or not injecting the hot carriers into the floating gate. In other words, during the program cycle, the memory cell 100 is subjected to the program action or the program inhibition through a single write action. Consequently, the memory cell 100 is in one of two different storage states.

During the single write action, a higher program voltage Vpp and a longer write time are used to ensure that a large number of hot carriers are injected into the floating gate and the memory cell 100 is in the second storage state. For example, the program voltage Vpp is 8V, and the write time is about 50 µs. Since a large number of hot carriers are injected into the floating gate, the generated cell current of the memory cell 100 is higher than 30 µA during the read action.

In some situations, the memory cell 100 is a multi-level memory cell. That is, one memory cell stores the data with at least two bits. For example, if the multi-level memory cell is able to store a 2-bit data, the data of the memory cell indicates one of a first storage state, a second storage state, a third storage state and a fourth storage state. Similarly, if the multi-level memory cell is able to store a 3-bit data, the multi-level memory cell has eight ($=2^3$) storage states. Similarly, if the multi-level memory cell is able to store a 4-bit data, the multi-level memory cell has sixteen ($=2^4$) storage states.

In the conventional multi-level memory cell, the difference between the cell currents corresponding to different storage states is higher. Generally, the difference between the cell currents corresponding to every two adjacent storage states is about 10 µA. For example, if the multi-level memory cell is able to store the 3-bit data, the cell current corresponding to the eighth state is about 80 µA, the cell current corresponding to the seventh state is about 70 µA, and the cell current corresponding to the sixth state is about 60 µA. The rest may be deduced by analog. In other words, the operation of the multi-level memory cell array cannot meet the power-saving requirement.

In the field of artificial intelligence (AI), a large number of in-memory computing (IMC) applications are needed. In IMC applications, the multi-level memory cells are used to store weighting values. For meeting the low-power computing requirement, the current difference between different storage states of the multi-level memory cell for the IMC applications should be as small as possible. For example, if the multi-level memory cell is able to store the 4-bit data, the cells currents corresponding to the sixteen memory states are in the range between 0.1 µA and 1.6 µA. For example, the cell current corresponding to the sixteenth state is about 1.6 µA, the cell current corresponding to the fifteenth state is about 1.5 µA, and the cell current corresponding to the fourteenth state is about 1.4 µA. The rest may be deduced by analog.

For controlling the multi-level memory cell to generate accurate cell currents in the IMC applications, the amount of hot carriers to be injected into the floating gate should be accurately controlled during the program cycle. Consequently, the memory cell can be programmed to one of various storage states. It was found that the biasing method as shown in FIG. 1B was unable to achieve the above purpose.

SUMMARY OF THE INVENTION

An embodiment of the present invention provides a programming and verifying method for a multi-level memory cell array. The multi-level memory cell array includes a first row, plural memory cells in the first row being connected with a first word line, a source line, an erase line and plural bit lines. Each of the plural memory cells is programmed to a target storage state of X storage states. The programming and verifying method includes the following steps. In a step (a1), the first row is set as a selected row, and A is set as 1. In a step (a2), first-portion memory cells of the selected row are programmed to the A-th storage state. The memory cells in the selected row excluding the memory cells in the target storage state and bad memory cells are defined as the first-portion memory cells of the selected row. In a step (a3), if A is not equal to X, 1 is added to X and the step (a2) is performed again. In a step (a4), if A is equal to X, the program cycle is ended, wherein A and X are integers. In the step (a2), the first-portion memory cells of the selected row are subjected to plural write actions and plural verification actions until all of the first-portion memory cells reach the A-th storage state.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 3A and 3B schematically illustrate the cell current distribution of the memory cells in various storage states;

FIG. 4 schematically illustrates bias voltages for performing associated operations on the multi-level memory cell of the present invention;

FIG. 7 schematically illustrates the complete contents of a program bias table in all programming stages;

DETAILED DESCRIPTION OF PREFERRED EMBODIMENTS

Figures 1A, 1B:
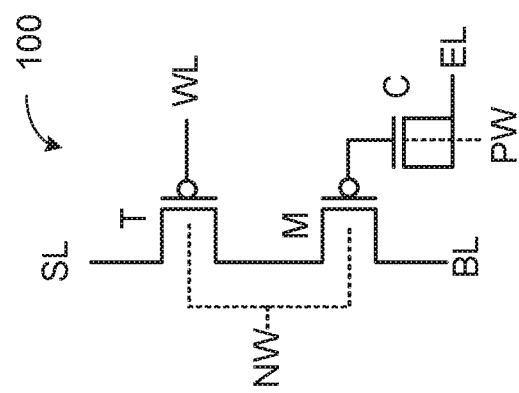
FIG. 1A (prior art) is a schematic circuit diagram illustrating a conventional MTP memory cell with a floating gate transistor.
FIG. 1B (prior art) schematically illustrates bias voltages for performing associated operations on the MTP memory cell as shown in FIG. 1A.

The present invention provides a programming and verifying method for a multi-level memory cell array. The memory cells of the multi-level memory cell array have the structures of the memory cells as shown in FIG. 1A. Since the memory cells of the multi-level memory cell array are multi-level memory cells, each memory cell has at least four storage states. In different storage states, the magnitudes of the cell currents generated by the memory cells are different.

Figure 2:
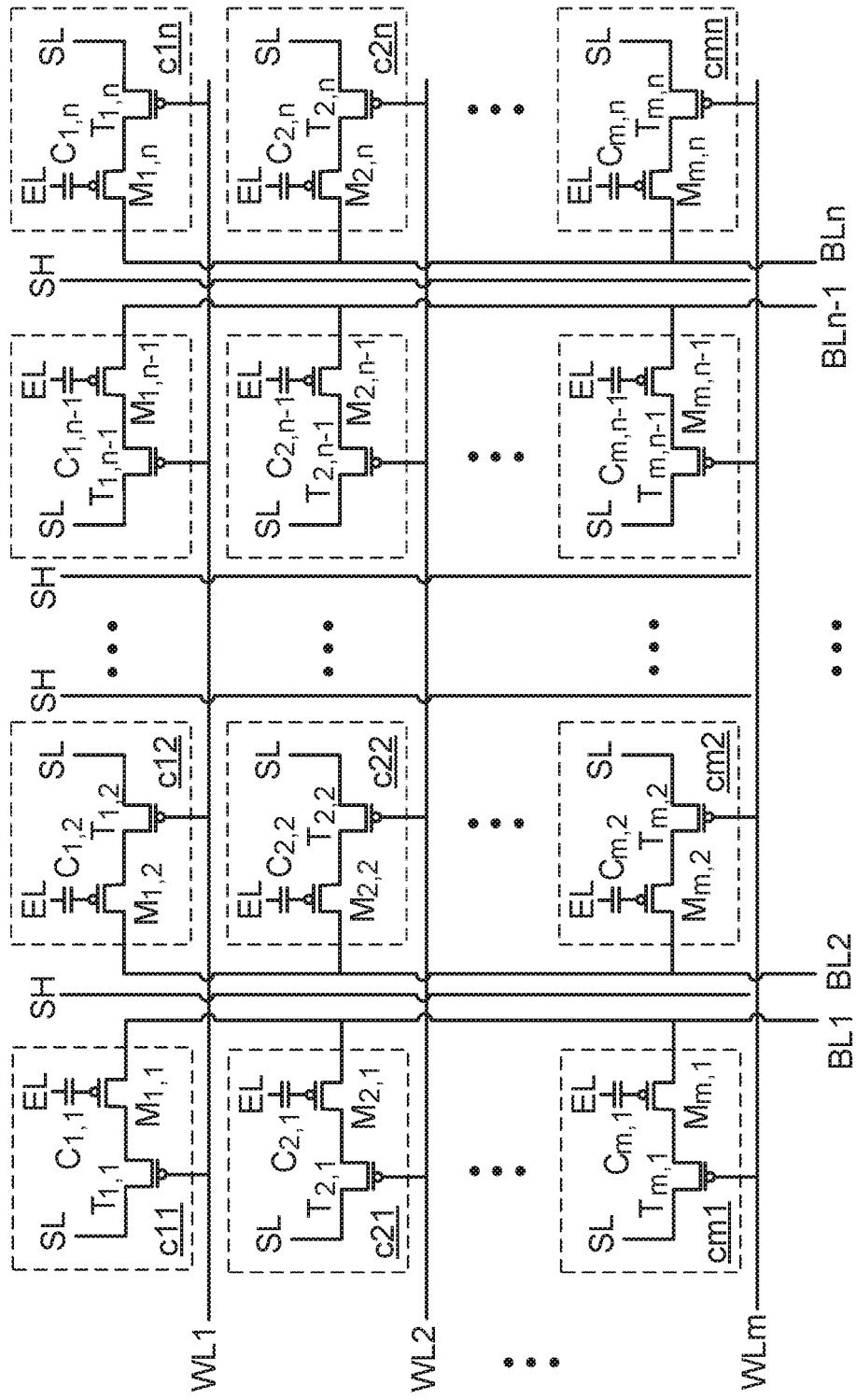
FIG. 2 is a schematic circuit diagram illustrating a memory cell array according to an embodiment of the present invention.

FIG. 2 is a schematic circuit diagram illustrating a memory cell array according to an embodiment of the present invention. As shown in FIG. 2, the memory cell array 200 comprises a plural memory cells c11~cmn in an m×n array arrangement, wherein m and n are positive integers. The memory cells c11~cmn comprise select transistors $T_{1,1}$~$T_{m,n}$, floating gate transistors $M_{1,1}$~$M_{m,n}$ and capacitors $C_{1,1}$~$C_{m,n}$, respectively. Each of the memory cells c11~cmn has the structure of the MTP memory cell as shown in FIG. 1A. It is noted that the structure of the memory cell is not restricted. The source terminals of the memory cells c11~cmn are connected with a source line SL. The second terminals of the capacitors $C_{1,1}$~$C_{m,n}$ are all connected with an erase line EL.

The gate terminals of the select transistors $T_{1,1}$~$T_{1,n}$ of n memory cells c11~c1n in the first row of the memory cell array 200 are connected with a word line WL1. The drain terminals of the floating gate transistors $M_{1,1}$~$M_{1,n}$ of the n memory cells c11~c1n in the first row are connected with the corresponding bit lines BL1~BLn, respectively. The gate terminals of the select transistors $T_{2,1}$~$T_{2,n}$ of n memory cells c21~c2n in the second row of the memory cell array 200 are connected with a word line WL2. The drain terminals of the floating gate transistors $M_{2,1}$~$M_{2,n}$ of the n memory cells c21~c2n in the second row are connected with the corresponding bit lines BL1~BLn, respectively. The connecting relationships between the memory cells of other rows are similar, and not redundantly described herein.

Generally, during the program cycle or the read cycle of the non-volatile memory, only one of the m word lines WL1~WLm of the memory cell array 200 is activated and the other word lines are inactivated. For example, if the word line WL1 is activated during the program action, the first row is the selected row. After the memory cells c11~c1n in the selected row are subjected to the write action many times, the memory cells c11~c1n are programmed to the corresponding storage states.

For preventing from the interference between the memory cells c11~cmn during the program cycle and the read cycle, the memory cell array 200 further comprises a shielding line SH. The shielding line SH is not connected with the memory cells c11~cmn of the memory cell array 200. Due to the shielding line SH, the coupling effect caused from the difference between the hot carrier numbers of the memory cells can be avoided. Generally, during the read cycle and the program cycle, the shielding line SH and the erase line EL receive the same voltage to prevent from the coupling effect between the memory cells.

According to the amount of hot carriers injected into the floating gate of the multi-level memory cell from low to high, the memory cell has the storage states from a first storage state to an X-th storage state, wherein X is larger than or equal to 4. That is, the amount of hot carriers stored in the floating gate of the memory cell in the first storage state is the lowest, and the amount of hot carriers stored in the floating gate of the memory cell in the X-th storage state is the highest.

FIGS. 3A and 3B schematically illustrate the cell current distribution of the memory cells in various storage states.

As shown in FIG. 3A, the multi-level memory cell is able to store the 4-bit data, i.e., X=16. The multi-level memory cell is programmed to one of sixteen storage states from the first storage state (1st) to the sixteenth storage state (16th) according to the amount of hot carriers injected into the floating gate of the multi-level memory cell from low to high. The magnitudes of the generated cell currents corresponding to the four storage states are different during the read action. For example, the generated cell current corresponding to the first storage state is 0.1 µA, the generated cell current corresponding to the second storage state is 0.2 µA, and the generated cell current corresponding to the third storage state is 0.3 µA. The rest may be deduced by analog. The generated cell current corresponding to the sixteenth storage state is 1.6 µA.

Similarly, in case that multi-level memory cell is able to store the 3-bit data (i.e., X=8), the multi-level memory cell is programmed to one of eight storage states from the first storage state to the eighth storage state. Similarly, in case that multi-level memory cell is able to store the 2-bit data (i.e., X=4), the multi-level memory cell is programmed to one of four storage states from the first storage state to the fourth storage state.

As shown in FIG. 3B, the multi-level memory cell is able to store the 2-bit data. For example, the generated cell current corresponding to the first storage state is 0.2 µA, the generated cell current corresponding to the second storage state is 0.6 µA, the generated cell current corresponding to the third storage state is 1.0 µA, and the generated cell current corresponding to the fourth storage state is 1.4 µA. The magnitudes of the cell currents corresponding to various storage states are not restricted. That is, the magnitudes of the cell currents corresponding to various storage states may be adjusted according to the characteristics of the memory cells.

For controlling the multi-level memory cell to generate accurate cell currents in the IMC applications, the amount of hot carriers to be injected into the floating gate should be accurately controlled. For achieving this purpose, the present invention provides a programming and verifying method for a multi-level memory cell array. During the program cycle, plural write actions are performed to gradually accumulate the hot carriers that are injected into the floating gate. In addition, a verification action is immediately performed to judge whether the memory cell reaches a predetermined storage state. Moreover, the time period of performing each write action is very short (e.g., 100 ns). Consequently, only few hot carriers can be injected into the floating gate of the memory cell.

FIG. 4 schematically illustrates bias voltages for performing associated operations on the multi-level memory cell of the present invention. During a program cycle, a write action is performed. Consequently, the memory cell is programmed (PGM), or the memory cell is subjected to a program inhibition (PGM inhibit).

When the program action is performed on the memory cell, an on voltage Von1 is provided to the word line WL, a program voltage Vpp is provided to the source line SL and the N-type well region NW, a ground voltage (e.g., 0V) is provided to the bit line BL and the P-type well region PW, and an erase voltage $V_{EL}$ is provided to the erase line EL and the shielding line SH. Meanwhile, the select the transistor T is turned on, and the program path between the source line SL and the bit line BL generates a program current. Consequently, the electrons are injected into the floating gate through a channel region of the floating gate transistor.

When the program inhibition is performed on the memory cell, an on voltage Von1 is provided to the word line WL, a program voltage Vpp is provided to the source line SL and the N-type well region NW, a ground voltage (e.g., 0V) is provided to the P-type well region PW, an erase voltage $V_{EL}$ is provided to the erase line EL and the shielding line SH, and the bit line BL is in a floating state (F). Meanwhile, no program current is generated between the source line SL and the bit line BL. Consequently, no electrons are injected into the floating gate of the floating gate transistor.

As mentioned above, the memory cell is subjected to the write action many times during the program cycle. Consequently, the program voltage Vpp and the erase voltage $V_{EL}$ will vary with the number of write actions. For example, the program voltage Vpp varies from 6.35V to 6.95V, and the erase voltage $V_{EL}$ varies from 1.5V to 3.25V. Moreover, the on voltage Von1 is 4.5V.

During a read cycle, the memory cell is read (READ), or the memory cell is subjected to a read inhibition (READ inhibit). When the memory cell is read, the memory cell generates a cell current. When the memory cell is subjected to the read inhibition, the memory cell does not generate the cell current. For judging the storage state of the selected memory cell, the selected memory cell is read during the read action and thus the selected memory cell generates the cell current. In case that the storage state of the selected memory cell is known or it is not necessary to judge the storage state of the selected memory cell, the selected memory cell is subjected to the read inhibition and thus the selected memory cell does not generate the cell current.

For reading the memory cell, an on voltage Von2 is provided to the word line WL, a read voltage Vr (e.g., 2.1V) is provided to the source line SL and the N-type well region NW, a ground voltage (0V) is provided to the erase line EL, the shielding line SH and the P-type well region PW, and a bias voltage of 1.2V is provided to the bit line BL. Meanwhile, the select the transistor is turned on, and the memory cell generated a cell current through the bit line BL. The magnitude of the read current is dependent on the amount of electrons stored in the floating gate of the floating gate transistor. During the read cycle, a sense amplifier (not shown) is connected with the bit line BL to receive the read current. According to the magnitude of the read current flowing through the bit line BL, the sense amplifier determines the storage state of the memory cell.

When the memory cell is subjected to the read inhibition, the on voltage Von2 is provided to the word line WL, a read voltage Vr (e.g., 2.1V) is provided to the source line SL and the N-type well region NW, a ground voltage (0V) is provided to the erase line EL, the shielding line SH and the P-type well region PW, and the bit line BL is in a floating state (F). Meanwhile, no program current is generated by the memory cell. For example, the on voltage Von2 is equal to the ground voltage (0V).

During an erase cycle (ERS), a ground voltage (e.g., 0V) is provided to the word line WL, the source line SL, the N-type well region NW, the bit line BL, the shielding line SH and the P-type well region PW, and an erase voltage (e.g., 14V) is provided to the erase line EL. Consequently, the electrons stored in the floating gate are transferred through the capacitor C and ejected to the erase line EL.

In an embodiment, plural write actions and plural verification actions are performed on the memory cell during the program cycle. Moreover, the time period of performing each write action is very short (e.g., 100 ns). Consequently, few hot carriers are injected into the floating gate of the memory cell. After the write action is completed, the verification action is immediately performed to judge whether the magnitude of the cell current generated by the memory cell complies with a predetermined storage state. If the magnitude of the cell current generated by the memory cell does not comply with the predetermined storage state, the write action is continuously performed to inject few hot carriers into the floating gate of the memory cell again.

Hereinafter, the multi-level memory cell capable of storing 2-bit data will be taken as an example to describe the concepts of the present invention. It is noted that the technology of the present invention can be applied to the multi-level memory cell capable of storing the data with more than two bits.

Figure 5A:
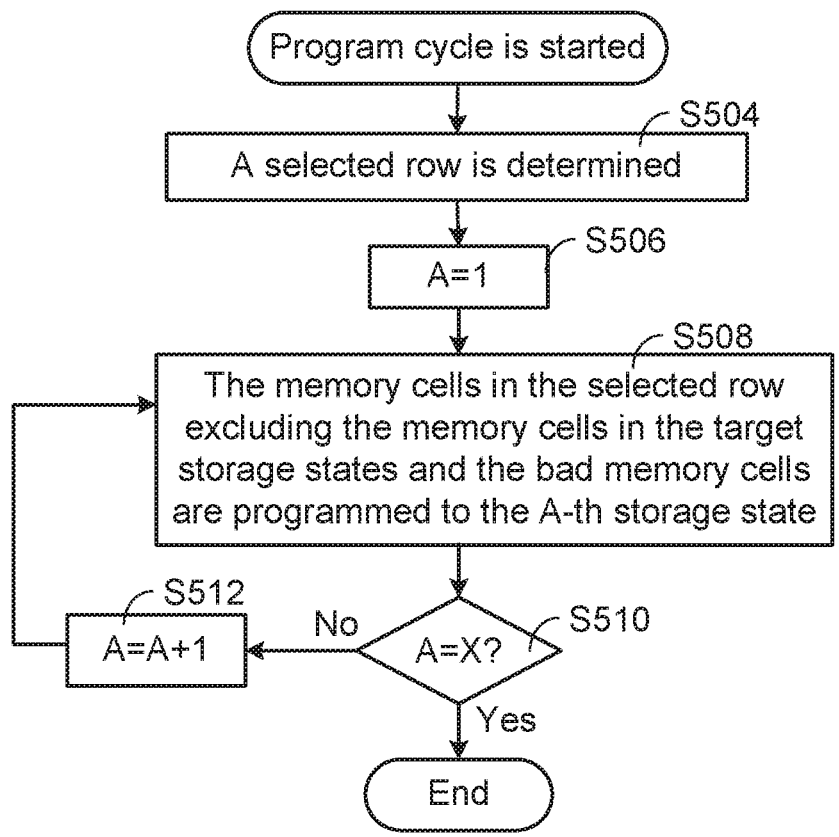
FIG. 5A is a flowchart illustrating a program control method for a multi-level memory cell according to an embodiment of the present invention.
Figure 5B:
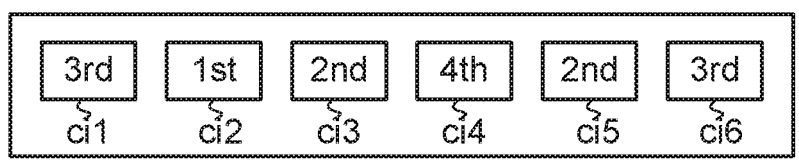
FIG. 5B schematically illustrates the target storage states of the memory cells in the selected row.
Figures 5C, 6A:
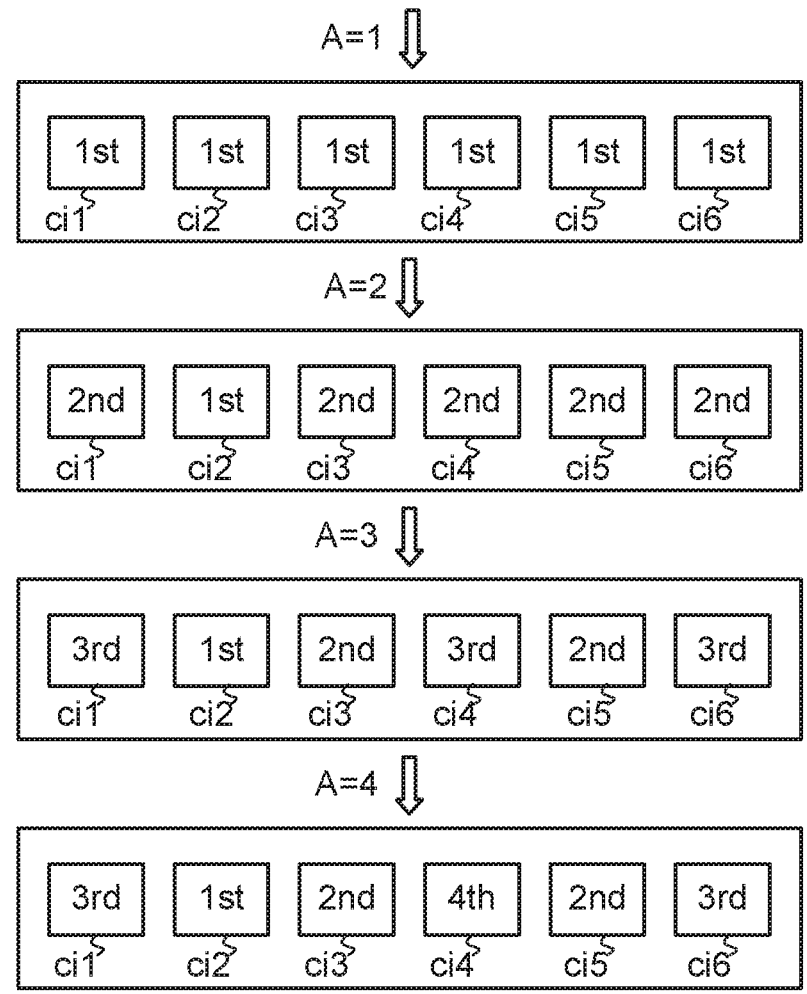
FIG. 5C schematically illustrates the operation of the program control method.
FIG. 6A schematically illustrates a program bias table for programming the memory cells to the second storage state in a programming stage.

Please refer to FIGS. 5A, 5B and 5C. FIG. 5A is a flowchart illustrating a program control method for a multi-level memory cell according to an embodiment of the present invention. FIG. 5B schematically illustrates the target storage states of the memory cells in the selected row. FIG. 5C schematically illustrates the operation of the program control method. During a program cycle, a selected row of the memory cell array 200 is determined, and the n memory cells of the selected row are successively programmed to the target storage states.

In an embodiment, each program cycle contains plural programming stages. Please refer to FIG. 5A. After the program cycle is started, a selected row is determined from the memory cell array 200 (Step S504). In addition, A is set as 1 (Step S506) to indicate the stage of programming to the first storage state.

Then, the memory cells in the selected row excluding the memory cells in the target storage states and the bad memory cells are programmed to the A-th storage state (Step S508). In the step S508, the good memory cells that have not reached the A-th storage state are subjected to plural write actions and plural verification actions until these good memory cells reach the A-th storage state.

Then, a step S510 is performed to judge whether A is equal to X. If A is not equal to X, A is added by 1 (Step S512) and the step S508 is repeatedly done and a next programming stage is started. Whereas, if A is equal to X, it means that all of the memory cells in the selected row have reached the target storage states. Then, the program cycle is ended. In the above embodiment, A and X are positive integers.

The operations of the program control method will be illustrated with reference to FIGS. 5B and 5C. As shown in FIG. 5B, the selected row (e.g., the i-th row) of the memory cell array comprises six memory cells $ci1$~$ci6$. The target storage states of the six memory cells $ci1$~$ci6$ are the third storage state (3rd), the first storage state (1st), the second storage state (2nd), the fourth storage state (4th), the second storage state (2nd) and the third storage state (3rd), respectively. That is, during the program cycle, the six memory cells $ci1$~$ci6$ of the i-th row need to be programmed to the target storage states.

Please refer to FIG. 5C. Firstly, A is 1 to indicate the stage of programming to the first storage state. After the write actions and the verification actions are performed on the memory cells $ci1$~$ci6$ many times, all of the memory cells $ci1$~$ci6$ have reached the first storage state (1st). After this stage, the memory cell $ci2$ has reached the target storage state.

Then, A is 2 to indicate the stage of programming to the second storage state. The memory cell $ci2$ in the selected row has reached the target storage state. After the write actions and the verification actions are performed on the memory cell $ci1$ and the memory cells $ci3$~$ci6$ of the selected row many times, all of these memory cells have reached the second storage state (2nd). After this stage, the memory cells $ci3$ and $ci5$ have reached the target storage state.

Then, A is 3 to indicate the stage of programming to the third storage state. The memory cells ci2, ci3 and ci5 in the selected row have reached the target storage state. After the write actions and the verification actions are performed on the memory cells ci1, ci4 and ci6 many times, all of these memory cells have reached the third storage state (3rd). After this stage, the memory cells ci1 and ci6 have reached the target storage state.

Then, A is 4 to indicate the stage of programming to the fourth storage state. The memory cells ci1~ci3 and ci5~ci6 in the selected row have reached the target storage state. After the write actions and the verification actions are performed on the memory cell ci4 many times, the memory cell ci4 has reached the fourth storage state (4th). After this stage, all of the memory cells ci1~ci6 in the selected row have reached the target storage state. Meanwhile, the program cycle of the selected row is ended.

Then, the new program cycle of the next selected row of the memory cell array 200 is started.

As mentioned above, during the program cycle of the multi-level memory cell for storing the 2-bit data, four (i.e., X=4) programming stages are required to confirm whether all memory cells of the selected row have been programmed to the target storage states. Similarly, during the program cycle of the multi-level memory cell for storing the 3-bit data, eight (i.e., X=8) programming stages are required to confirm whether all memory cells of the selected row have been programmed to the target storage states. Similarly, during the program cycle of the multi-level memory cell for storing the 4-bit data, sixteen (i.e., X=16) programming stages are required to confirm whether all memory cells of the selected row have been programmed to the target storage states.

As mentioned above, in each programming stage, plural write actions are required to program the memory cells to the predetermined storage state. Generally, there are characteristic differences between different memory cells. Consequently, in each programming stage, the verification action is required to judges whether the memory cells have been programmed to the target storage state. The target storage state is one of the first storage state, the second storage state, the third storage state and the fourth storage state. Hereinafter, a process of programming the memory cells to the second storage state in the programming stage will be illustrated.

Figure 6B:
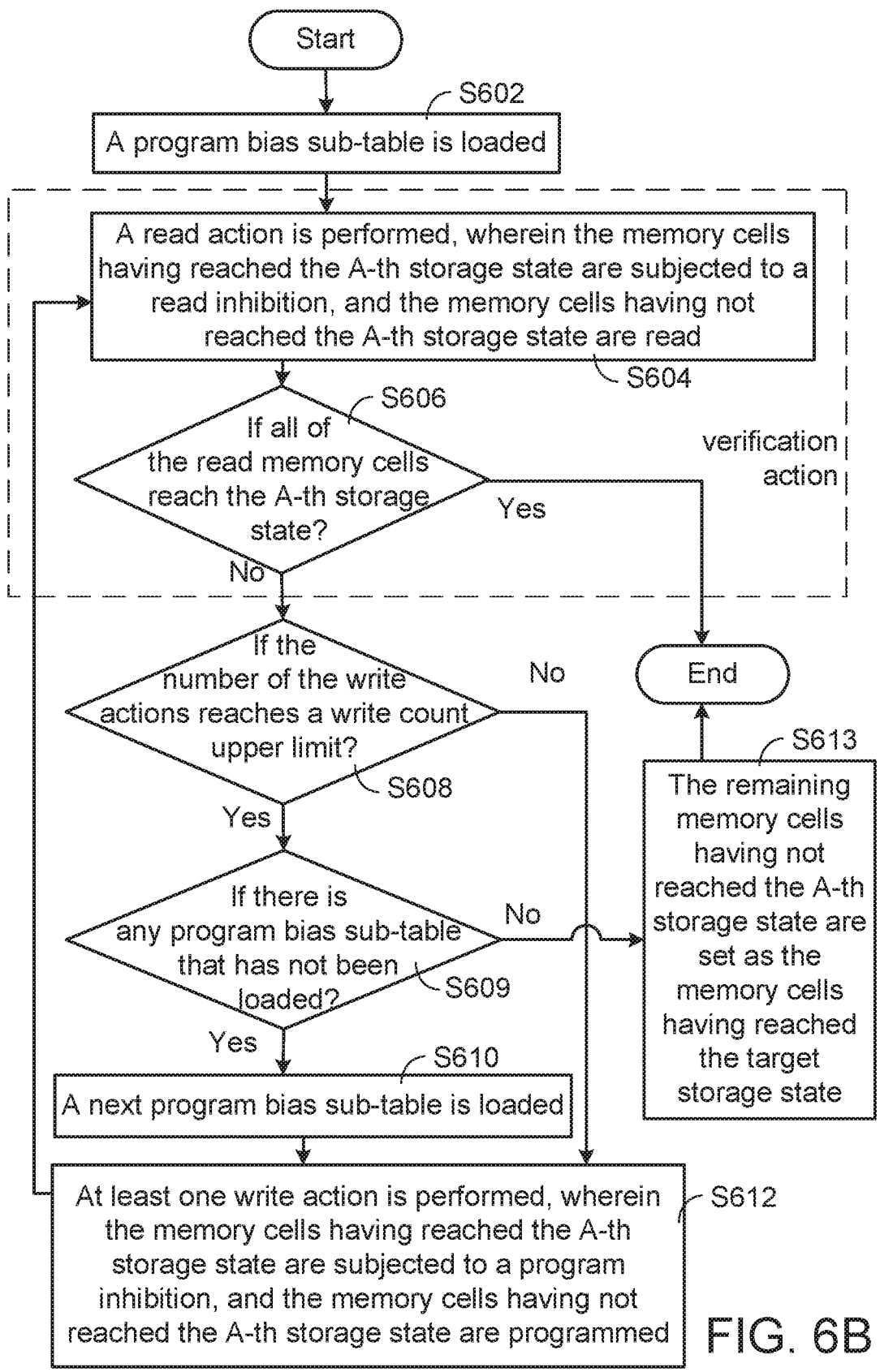
FIG. 6B is a flowchart illustrating the operations of the programming stage.

Please refer to FIGS. 6A and 6B. FIG. 6A schematically illustrates a program bias table for programming the memory cells to the second storage state in a programming stage. FIG. 6B is a flowchart illustrating the operations of the programming stage.

As shown in FIG. 6A, the program bias table for programming the memory cells to the second storage state comprises plural program bias sub-tables $Q_2[1]$-$Q_2[8]$. These program bias sub-tables are loaded in the sequence from $Q_2[1]$ to $Q_2[8]$.

Each of the program bias sub-tables $Q_2[1]$-$Q_2[8]$ contains three fields to indicate the program voltage Vpp, the erase voltage $V_{EL}$ and the write count upper limit in the programming stage. For example, the program bias sub-table indicates that the program voltage Vpp is 6.45V, the erase voltage $V_{EL}$ is 1.5V and the write count upper limit is 24.

Please refer to FIG. 6B. When the programming stage is started, the program bias sub-table is loaded (Step S602). Then, in a step S604 and a step S606, a verification action is performed.

While the verification action is performed, a read action is performed. The memory cells having reached the A-th storage state are subjected to a read inhibition, and the memory cells having not reached the A-th storage state are read (Step S604). Then, the step S606 is performed to judge whether all of the read memory cells reach the A-th storage state. When all of the read memory cells of the selected row have reached the A-th storage state, the programming stage is ended.

For example, the A-th storage state is the second storage state. Except for the memory cells reaching the target storage state, the memory cells of the selected row having reached the second storage state are subjected to the read inhibition. Moreover, the memory cells having not reached the A-th storage state are read. Then, the step S606 is performed to judge whether all of the read memory cells reach the second storage state.

For example, the cell current generated by the memory cell in the second storage state is 0.2 μA. If the cell current of the memory cell in the selected row is higher than or equal to 0.2 μA during the verification action, it is confirmed that the memory cell has reached the second storage state. Whereas, if the cell current of the memory cell in the selected row is lower than 0.2 μA during the verification action, it is confirmed that the memory cell has not reached the second storage state. The memory cells having not reached the second storage state need to be subjected to the write action again.

In case that some memory cells in the selected row have not reached the A-th storage state, a step S608 is performed to judge whether the number of the write actions reaches the write count upper limit. That is, the step S608 is performed to judge whether the number of the write actions reaches the write count that is listed in the program bias sub-table.

If the number of the write actions is smaller than the write count upper limit, at least one write action is performed again. That is, the memory cells having reached the A-th storage state is subjected to a program inhibition, and the memory cells having not reached the A-th storage state is programmed (Step S612). In the step S612, the memory cells of the selected row having reached the second storage state are subjected to the program inhibition. Of course, the memory cells of the selected row having reached the target storage state are subjected to the program inhibition. Consequently, only the memory cells of the selected row having not reached the second storage state are programmed. That is, the write action is performed according to the program voltage Vpp and the erase voltage $V_{EL}$ in the program bias sub-table. Consequently, the hot carriers are re-injected into the memory cells that have not reached the second storage state. After the at least one write action is completely, the step S604 of the verification action is repeatedly done.

If the number of the write actions reaches the write count upper limit, it means that the some memory cells subjected to the write action according to the contents of the old program bias sub-table are still unable to reach the second storage state. Then, a step S609 is performed to judge whether there is any program bias sub-table that has not been loaded. If the judging condition of the step S609 is satisfied, the next program bias sub-table is loaded (Step S610) and the step S612 is performed. The write action is performed according to the program voltage Vpp and the erase voltage $V_{EL}$ in the new program bias sub-table. Consequently, the hot carriers are re-injected into the memory cells that have not reached the second storage state. After the at least one write action is completely, the step S604 of the verification action is repeatedly done.

As mentioned above, in the stage of programming to the second storage state, the program bias sub-table $Q_2[1]$ is firstly loaded and the write action and the verification action are performed according to the contents of the program bias sub-table $Q_2[1]$. If some memory cells of the selected row have not reached the second storage state after the write action has been performed for 24 times, the program bias sub-table $Q_2[2]$ is loaded. Similarly, if some memory cells of the selected row have not reached the second storage state after the write action has been performed for 24 times, the program bias sub-table $Q_2[3]$ is loaded. The rest may be deduced by analog. The above procedures are repeatedly done until all of the memory cells excluding the memory cells in the target storage state reach the second storage state.

If the judging condition of the step S609 is not satisfied after all of the program bias sub-tables $02[1]~Q_2[8]$ are loaded, the memory cells having not reached the second storage state may be considered as bad memory cells. Consequently, the remaining memory cells having not reached the A-th storage state (e.g., the second storage state) are set as the memory cells having reached the target storage state (Step S613). Then, the stage of programming to the second storage state is aborted.

As mentioned above, in the stage of programming to the second storage state, at most eight program bias sub-tables $Q_2[1]~Q_2[8]$ are loaded sequentially. Moreover, in the stage of programming to the second storage state, at most 192 (=8×24) write actions are performed. It is noted that the values of the program voltage Vpp, the erase voltage $V_{EL}$ and the write count upper limit in FIG. 6A are not restricted. That is, these values may be modified according to the practical requirements.

It is noted that numerous modifications and alterations may be made while retaining the teachings of the invention. For example, in another embodiment, the plural program bias sub-tables as shown in FIG. 6B are replaced by a single bias sub-table. Under this circumstance, the steps S602 and S610 of loading the bias sub-table are omitted, and the steps S608, S609 and S613 are deleted. That is, if the read memory cells have not reached the A-th storage state, the step S612 is performed.

FIG. 7 schematically illustrates the complete contents of a program bias table in all programming stages. The flowchart of FIG. 6B according to the program bias table of FIG. 7 may be considered as the operation procedure of one program cycle.

The program bias table of FIG. 7 contains four program bias tables for programming the memory cells to the four storage states in four programming stages. The program bias table for programming the memory cells to the first storage state contains plural program bias sub-tables $Q_1[1]~Q_1[8]$. The program bias table for programming the memory cells to the second storage state contains plural program bias sub-tables $Q_2[1]~Q_2[8]$. The program bias table for programming the memory cells to the third storage state contains plural program bias sub-tables $Q_3[1]~Q_3[8]$. The program bias table for programming the memory cells to the fourth storage state contains plural program bias sub-tables $Q_4[1]~Q_4[8]$. In other words, the four programming stages of the program cycle are performed according to the program bias table of FIG. 7, the flowchart of FIG. 6B and the cell currents corresponding to the four storage states. Consequently, all memory cells in the selected row are programmed to the target storage states.

Similarly, in case that the multi-level memory cell is able to store the 3-bit data, the program cycle contains eight programming stages and the program bias table for programming the memory cells to eight storage states is needed. Similarly, in case that the multi-level memory cell is able to store the 4-bit data, the program cycle contains sixteen programming stages and the program bias table for programming the memory cells to sixteen storage states is needed.

Figure 8A:
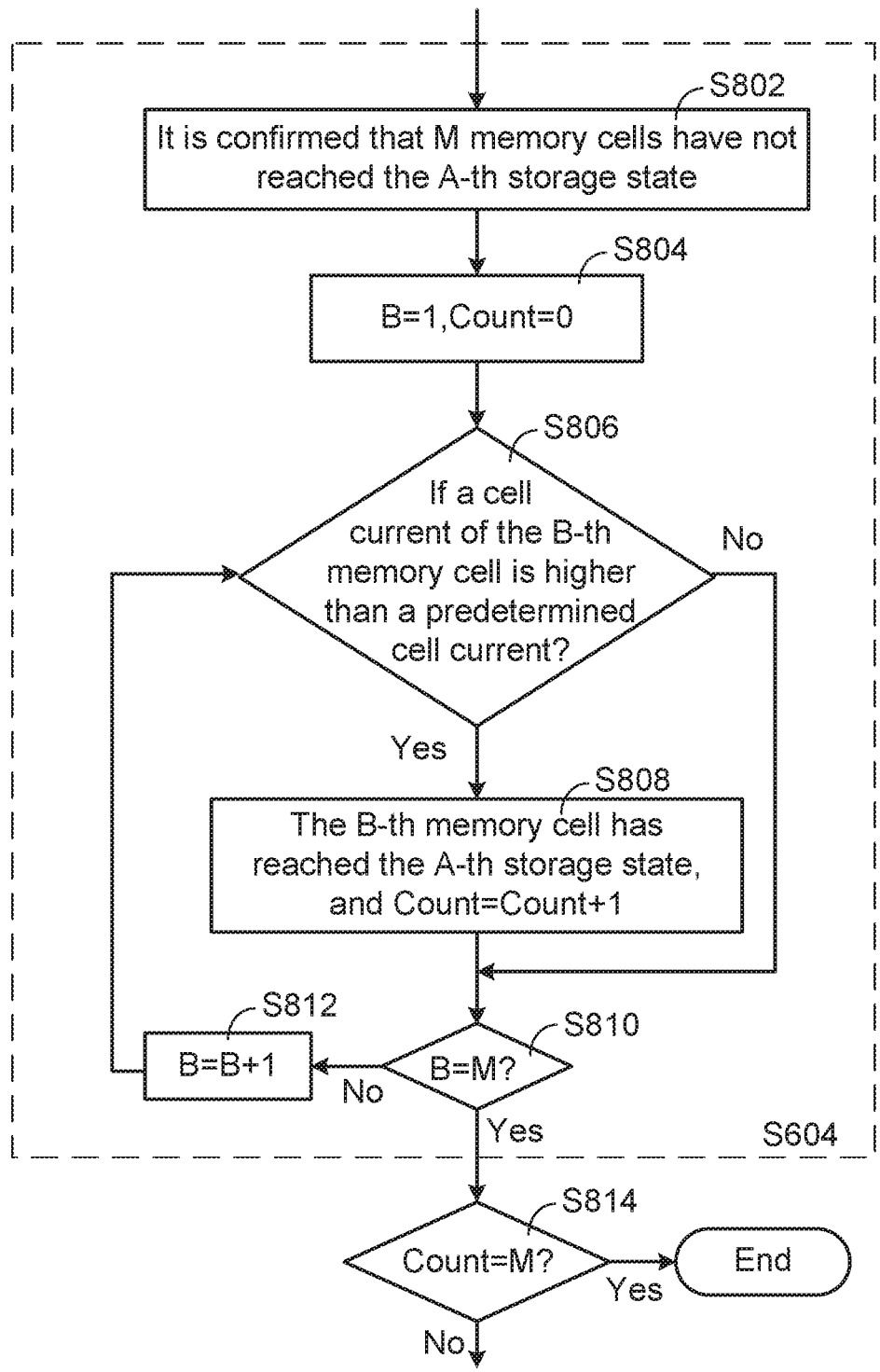
FIG. 8A is a flowchart illustrating an exemplary process of performing a verification action.

FIG. 8A is a flowchart illustrating an exemplary process of performing a verification action. Firstly, in a step S802, it is confirmed that M memory cells have not reached the A-th storage state. That is, except for the memory cells reaching the target storage state, the number of memory cells of the selected row having not programmed to the A-th storage state is M.

Then, B is set as 1 and a counting value Count is set as 0 (Step S804). The values B and Count are integers.

Then, a step S806 is performed to judge whether the cell current of the B-th memory cell is higher than or equal to a predetermined cell current. In an embodiment, the predetermined cell current is the cell current corresponding to the A-th storage state. In the step S806, the B-th memory cell is read, and thus the B-th memory cell generates the cell current. In addition, the cell current of the B-th memory cell is compared with the predetermined cell current.

If the cell current of the B-th memory cell is not higher than the predetermined cell current, it means that the B-th memory cell has not reached the A-th storage state. Then, a step S810 is performed.

Whereas, if the cell current of the B-th memory cell is higher than or equal to the predetermined cell current, it means that the B-th memory cell has reached the A-th storage state. Then, the counting value Count is added by 1 (Step S808), and a step S810 is performed. In the subsequent programming stages, the B-th memory cell will be subjected to the read inhibition and the program inhibition.

The step S810 is performed to judge whether B is equal to M. If B is not equal to M, B is added by 1 (Step S812) and the step S806 is repeatedly done. Whereas, if B is equal to M, a step S814 is performed to judge whether the counting value Count is equal to M.

In this embodiment, the step S810 is used to judge whether the M memory cells have been read and judged. If the judging condition of the step S810 is not satisfied, the other memory cells are continuously judged. Like the step S606, the step S814 is used to judge whether the read M memory cells have reached the A-th storage state.

Figure 8B:
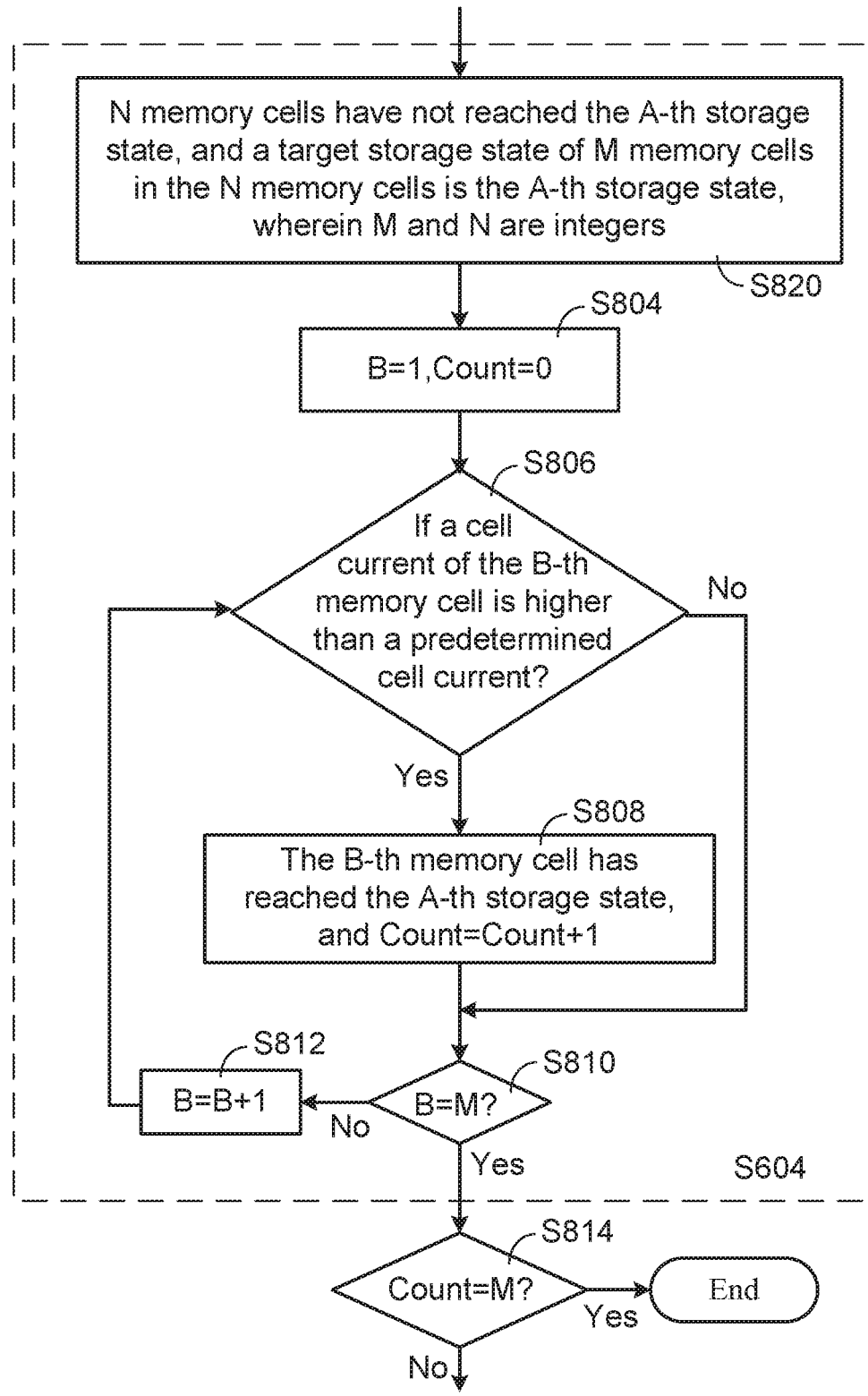
FIG. 8B is a flowchart illustrating another exemplary process of performing a verification action.

FIG. 8B is a flowchart illustrating another exemplary process of performing a verification action. In comparison with the flowchart of FIG. 8A, the flowchart of this embodiment further comprises a step S820 in replace of the step S802. In the step S820, it is confirmed that N memory cells have not reached the A-th storage state and a target storage state of M memory cells in the N memory cells is the A-th storage state, wherein M and N are integers. That is, in the verification action of FIG. 8B, only the memory cells of the selected row whose target storage state is the A-th storage state and whose storage states have not reached the A-th storage state. In comparison with the verification action of FIG. 8A, the number of memory cells to be verified in the verification action of FIG. 8B is reduced. Consequently, the time period of performing the verification action is reduced.

For further reducing the time period of the program cycle, one verification action is performed after plural write actions are performed. For example, in the step S612, two write actions are performed. After the step S612, the step S604 is repeatedly done.

In some embodiments, the number of write actions is dependent on the loaded program bias sub-table. Take the program bias sub-tables $Q_2[1]~Q_2[8]$ for example. After the program bias sub-table $Q_2[1]$ is loaded, the step S612 is performed to execute twelve write actions and then one verification action is performed. After the program bias sub-table $Q_2[2]$ is loaded, the step S612 is performed to execute four write actions and then one verification action is performed. After the program bias sub-table $Q_2[3]$ or $Q_2[4]$ is loaded, the step S612 is performed to execute two write actions and then one verification action is performed. After the program bias sub-table $Q_2[5]$, $Q_2[6]$, $Q_2[7]$ or $Q_2[8]$ is loaded, the step S612 is performed to execute one write action and then one verification action is performed.

From the above descriptions, the present invention provides a programming and verifying method for a multi-level memory cell array. The program cycle contains plural programming stages. In each programming stage, the write action and the verification action are continuously performed. After the program cycle is ended, it is confirmed that all memory cells in the selected row reach the target storage states.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A programming and verifying method for a multi-level memory cell array, the multi-level memory cell array comprising a first row, plural memory cells in the first row being connected with a first word line, a source line, an erase line and plural bit lines, each of the plural memory cells being programmed to a target storage state of X storage states, the programming and verifying method comprising steps of:
    (a1) determining the first row as a selected row, and setting A as 1;
    (a2) programming first-portion memory cells of the selected row to the A-th storage state, wherein the memory cells in the selected row excluding the memory cells in the target storage state and bad memory cells are defined as the first-portion memory cells of the selected row;
    (a3) if A is not equal to X, adding 1 to A, and performing the step (a2) again;
    (a4) if A is equal to X, ending the program cycle, wherein A and X are integers,
    wherein in the step (a2), the first-portion memory cells of the selected row are subjected to plural write actions and plural verification actions until all of the first-portion memory cells reach the A-th storage state.

2. The programming and verifying method as claimed in claim 1, wherein the step (a2) comprises steps of:
    (b1) performing a read action on the first-portion memory cells, wherein the memory cells memory cells having reached the A-th storage state are subjected to a read inhibition, and the memory cells having not reached the A-th storage state are read;
    (b2) if all of the read memory cells have reached the A-th storage state, performing the step (a3) again; and
    (b3) if some of the read memory cells have not reached the A-th storage state, programming the memory cells to the A-th storage state.

3. The programming and verifying method as claimed in claim 1, wherein the step (a2) comprises steps of:
    (c1) loading a program bias sub-table;
    (c2) performing a read action on the first-portion memory cells, wherein the memory cells memory cells having reached the A-th storage state are subjected to a read inhibition, and the memory cells having not reached the A-th storage state are read;
    (c3) if all of the read memory cells have reached the A-th storage state, performing the step (a3) again;
    (c4) if some of the read memory cells have not reached the A-th storage state, judging whether a number of the write actions reaches a write count upper limit;
    (c5) if the number of the write actions does not reach the write count upper limit, performing a step (c8);
    (c6) if the number of the write actions reaches the write count upper limit and there is any program bias sub-table that has not been loaded, performing the step (c8);
    (c7) if the number of the write actions reaches the write count upper limit and there is no program bias sub-table that has not been loaded, performing the step (a3) again; and
    (c8) performing at least one write action to allow the memory cells having reached the A-th storage state to undergo a program inhibition and allow the memory cells having not reached the A-th storage state to be programmed, and performing the step (c2) again.

4. The programming and verifying method as claimed in claim 3, wherein a program voltage, an erase voltage and the write count upper limit corresponding to the at least one write action are indicated by each of the program bias sub-table and the next program bias sub-table.

5. The programming and verifying method as claimed in claim 3, wherein the step (c2) comprises steps of:
    (d1) confirming that M memory cells of the first-portion memory cells have not reached the A-th storage state;
    (d2) setting B as 1, and setting a counting value as 0, wherein M, B and the counting value are integers;
    (d3) if a cell current generated by a B-th memory cell of the M memory cells is higher than or equal to a predetermined cell current, confirming that the B-th memory cell has reached the A-th storage state, and adding 1 to the counting value;
    (d4) if B is not equal to M, adding 1 to B, and performing the step (d3) again;
    (d5) if the counting value is equal to M, performing the step (a3) again; and
    (d6) if the counting value is not equal to M, performing the step (c4) again.

6. The programming and verifying method as claimed in claim 3, wherein the step (c2) comprises steps of:
    (d1) confirming that N memory cells of the first-portion memory cells have not reached the A-th storage state and a target storage state of M memory cells in the N memory cells is the A-th storage state;
    (d2) setting B as 1, and setting a counting value as 0, wherein M, B and the counting value are integers;
    (d3) if a cell current generated by a B-th memory cell of the M memory cells is higher than or equal to a predetermined cell current, confirming that the B-th memory cell has reached the A-th storage state, and adding 1 to the counting value;
    (d4) if B is not equal to M, adding 1 to B, and performing the step (d3) again;
    (d5) if the counting value is equal to M, performing the step (a3) again; and
    (d6) if the counting value is not equal to M, performing the step (c4) again.

7. The programming and verifying method as claimed in claim 1, wherein the memory cell array comprises a plural memory cells in an m×n array arrangement, wherein the plural memory cells are connected with m word lines, the source line, the erase line and n bit lines, wherein each of the plural memory cells is in one of X storage states, wherein X is larger than or equal to 4.

* * * * *